United States Patent
Chang et al.

(10) Patent No.: US 8,461,882 B2
(45) Date of Patent: Jun. 11, 2013

(54) DRIVER SUPPORTING MULTIPLE SIGNALING MODES

(75) Inventors: Ken Kun-Yung Chang, Los Altos, CA (US); Kashinath Prabhu, Karnataka (IN); Hae-Chang Lee, Los Altos, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 13/255,844

(22) PCT Filed: May 7, 2010

(86) PCT No.: PCT/US2010/034047
§ 371 (c)(1),
(2), (4) Date: Sep. 9, 2011

(87) PCT Pub. No.: WO2010/129873
PCT Pub. Date: Nov. 11, 2010

(65) Prior Publication Data
US 2011/0316590 A1    Dec. 29, 2011

Related U.S. Application Data

(60) Provisional application No. 61/176,428, filed on May 7, 2009.

(51) Int. Cl.
*H03K 3/00* (2006.01)

(52) U.S. Cl.
USPC .............. 327/108; 327/170; 327/391; 326/82

(58) Field of Classification Search
USPC ..................................... 327/100, 108; 326/82
See application file for complete search history.

(56) References Cited

U.S. PATENT DOCUMENTS

| | | | | |
|---|---|---|---|---|
| 5,491,455 A | * | 2/1996 | Kuo | 330/253 |
| 5,574,401 A | * | 11/1996 | Spitalny | 330/253 |
| 5,811,997 A | | 9/1998 | Chengson | |
| 6,310,814 B1 | | 10/2001 | Hampel | 365/222 |
| 6,456,122 B1 | * | 9/2002 | Park et al. | 327/55 |
| 6,856,178 B1 | | 2/2005 | Narayan | |
| 7,183,805 B2 | | 2/2007 | Wang | 326/86 |
| 2003/0087671 A1 | | 5/2003 | Ruha et al. | 455/557 |
| 2004/0000924 A1 | | 1/2004 | Best | 326/30 |

(Continued)

OTHER PUBLICATIONS

Crisp, Direct Rambus Technology: The New Main Memory Standard, IEEE Micro, 1997, pp. 18-28.*

(Continued)

*Primary Examiner* — Long Nguyen
*Assistant Examiner* — Patrick Chen
(74) *Attorney, Agent, or Firm* — Silicon Edge Law Group LLP; Arthur J. Behiel

(57) ABSTRACT

A driver supports differential and single-ended signaling modes. Complementary transistors with a common tail node are provided with complementary input signals in the differential mode. A current source coupled to the tail node maintains a relatively high tail impedance and a constant tail current in the differential mode. The tail node is set to a low impedance in single-ended modes to decouple the two transistors, allowing them to amplify uncorrelated input signals. The current source thaws multiple current levels in the single-ended mode to compensate for changes in tail current that result from changes in the relative values of the uncorrelated data in the single-ended modes. A termination block provides termination resistance in the differential mode, pull-up transistors in a single-ended mode that employs push-pull drivers, and is omitted in a single-ended mode that lacks driver-side termination.

24 Claims, 1 Drawing Sheet

U.S. PATENT DOCUMENTS

| | | | |
|---|---|---|---|
| 2005/0212553 A1* | 9/2005 | Best et al. | 326/30 |
| 2006/0158223 A1 | 7/2006 | Wang | 326/86 |
| 2007/0176638 A1 | 8/2007 | Park | 326/83 |
| 2008/0079458 A1 | 4/2008 | Shin et al. | 326/30 |
| 2009/0284292 A1* | 11/2009 | Wong et al. | 327/170 |

OTHER PUBLICATIONS

JEDEC Standard POD18-1.8 V Pseudo Open Drain, JESD8-19, Dec. 2006, Jedec Solid State Technology Association. 14 Pages.

Notification of Transmittal of the International Search Report and the Written Opinion with mail date of Nov. 30, 2010 for Int'l. Application No. PCT/US10/034047. 12 Pages.

PCT Preliminary Report dated Nov. 17, 2011 re Int'l. Application No. PCT/US2010/034047 filed May 7, 2010 includes Written Opinion. 9 Pages.

EP Extended Search Report mailed Nov. 2, 2012 re International Application No. 10772886.7. 11 pages.

\* cited by examiner

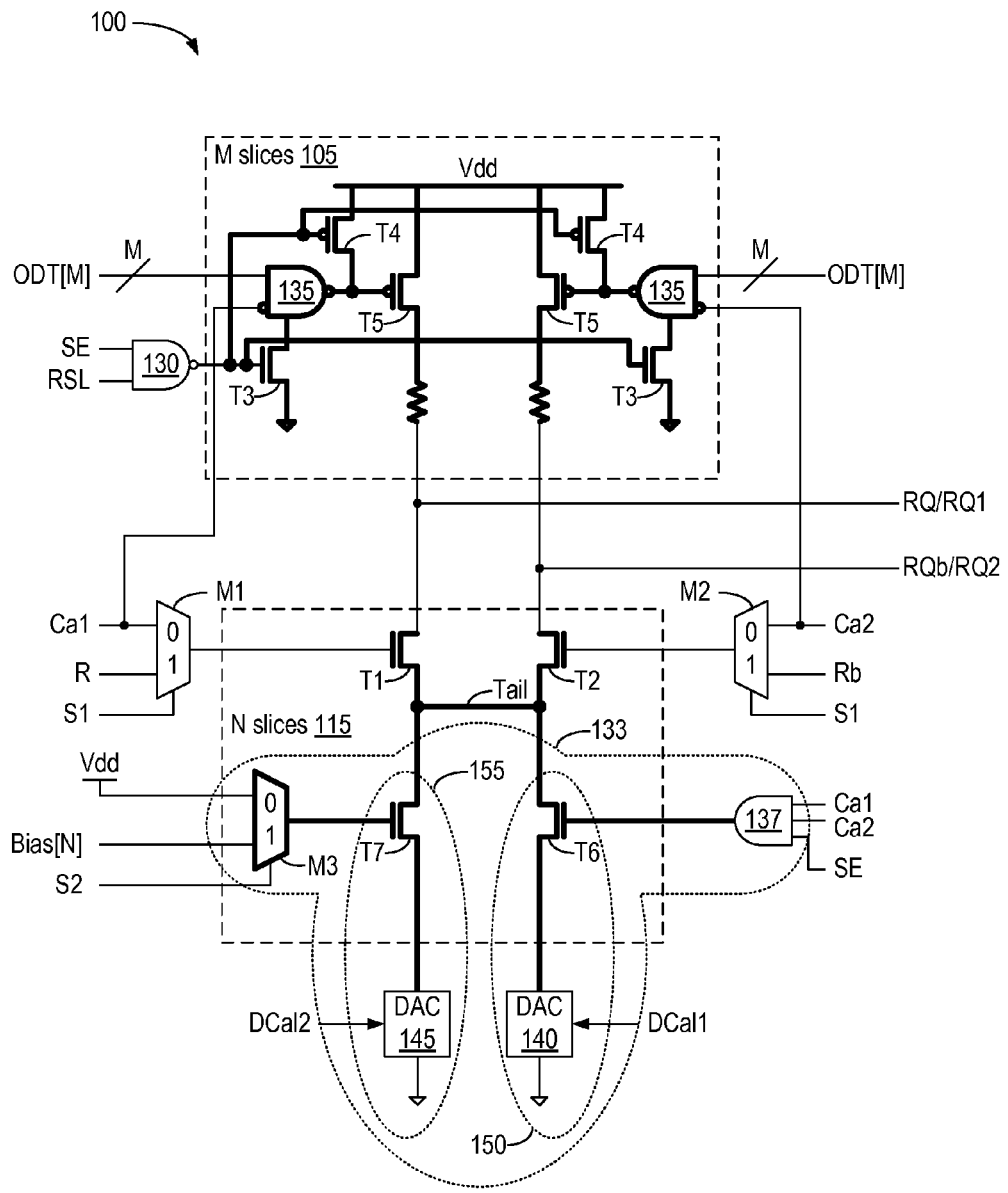

DRIVER SUPPORTING MULTIPLE SIGNALING MODES

FIELD

The invention relates generally to output drivers for integrated circuits, and in particular to multi-modal drivers that support multiple signaling schemes.

BACKGROUND

Output driver circuits, or simply "drivers," transmit electronic signals onto various forms of communication channels, including transmission lines, cables, printed circuit board traces, or the like. There are many types and classes of drivers, each offering a combination of traits that make it more or less suitable for particular applications. For example, "single-ended" drivers transmit signals as a varying voltage or current signal over a single conductor. The main alternative to the single-ended approach is differential signaling, in which differential drivers transmit information as complementary signals over a pair of conductors. Single-ended drivers are simpler and less expensive, whereas differential drivers offer relatively higher noise tolerance.

Output drivers and the signaling schemes they support are not limited to differential or single-ended signaling. There are other classes of signaling, and many species of the various classes. Integrated-circuit (IC) vendors can design their ICs to include driver circuits optimized for a specific application, but often prefer to address a larger market by supporting multiple signaling schemes. The resulting drivers can be complex, area-intensive, and expensive, and one or more of the supported signaling schemes may suffer reduced performance as compared with a tailored solution. There is therefore a need for improved multi-modal drivers.

BRIEF DESCRIPTION OF THE DRAWINGS

The subject matter disclosed is illustrated by way of example, and not by way of limitation, in the accompanying drawing and in which like reference numerals refer to similar elements and in which:

FIG. 1 depicts a multi-modal driver 100 in accordance with one embodiment.

DETAILED DESCRIPTION

FIG. 1 depicts a multi-modal driver 100 in accordance with one embodiment. In this example, driver 100 supports a differential mode and two single-ended modes. The first single-ended mode supports a signaling scheme referred to as "Rambus Signaling Logic" (RSL), which is detailed in U.S. Pat. No. 6,310,814 to Hampel et al., issued Oct. 30, 2001, and is incorporated herein by reference. The second single-ended mode supports a common signaling scheme called "Pseudo Open Drain Logic"(PODL), which is detailed in U.S. Patent Application Publication 2008/0079458 to Shin et al., published Apr. 3, 2008, and is also incorporated herein by reference.

Driver 100 includes complementary drive elements, driver transistors T1 and T2, selectively coupled to a supply node Vdd via a configurable, M-slice termination block 105, and to a ground node (a second supply node) via a configurable, N-slice tail block 115. The term "slice" means that the circuit elements depicted in blocks 105 and 115 are duplicated M and N times, respectively. Circuit elements that are replicated in multiple slices are depicted in FIG. 1 using relatively bold lines. Driver 100 includes other components that support the various modes. These components and their purposes are introduced below.

Differential Mode

Signals Ca1, Ca2, SE, and RSL are de-asserted (set to relatively low voltage levels representative of a logic zero) and signals S1 and S2 asserted in the differential mode. A pair of multiplexers M1 and M2, at the direction of select signal S1, conveys complementary input signals R and Rb to the control terminals of respective transistors T1 and T2. Signals R and Rb are amplified and inverted to create a differential output signal pair RQ/RQb.

One or more slices within termination block 105 are enabled in the differential mode. The number of enabled slices determines the output impedance of driver 100, and can be tuned as needed by application of M binary signals, one on each of M lines ODT[M] to corresponding slices. Because signals SE and RSL are not asserted, a NAND gate 130 keeps transistors T4 off and transistors T3 on. The gates of load transistors T5, in each slice, are therefore controlled by the output from a pair of NAND gates 135 associated with the same slice, and power is provided to NAND gates 135. Signals Ca1 and Ca2 are de-asserted, so the one of M signals ODT[M] connected to a given slice determines whether the corresponding load transistors T5 conduct. The slices are connected in parallel, so the more slices are enabled, the lower is the load resistance, and hence the output impedance for driver 100. The resistance changes can be e.g. binary or thermometer coded.

The tail slices 115 are also configured in the differential mode. A current source 133 defines a current path, the impedance through which is controlled to set the voltage on and current from a tail node Tail. Signal SE is not asserted, so an AND gate 137 turns off a tail transistor T6, which together with a digital-to-analog converter (DAC) 140 form one of two sub-sources 150 and 155 of current source 133. A second DAC 145 in sub-source 155 can be tuned by application of a digital calibration signal DCal2 to sink a desired level of tail current from tail node Tail to ground.

A multiplexer M3 coupled to another tail transistor T7 receives and N-bit bias signal on N lines, one line for each of the N slices of block 115. The number of enabled transistors T7 sets the bias voltage on tail node Tail, and can be tuned as needed by application of N binary signals, one on each of N lines Bias[N] to corresponding slices. Those of skill in the art are well versed in the calibration of drive characteristics for an amplifier by tuning e.g. termination impedance, tail current, and bias voltages. A detailed discussion of how to select DAC and slice settings is therefore omitted for brevity.

Single-Ended Mode: PODL

Driver 100 is split into two single-ended amplifiers in the single-ended modes, including the PODL mode. Differential input signals R and Rb are disabled. Instead, a pair of independent, single-ended input signals is provided on nodes Ca1 and Ca2. Signal S1 is de-asserted, so that uncorrelated signals Ca1 and Ca2 are independently amplified and inverted by respective transistors T1 and T2 to produce independent output signals RQ1 and RQ2.

Signal SE is asserted in the PODL single-ended mode, and signal RSL is de-asserted. Transistors T3 are on and transistor T4 are off, just as in the differential mode. Also like the differential mode, signals on lines ODT[M] can be asserted to enable any number of the M slices in block 105. The enabled slices are not always conducting, however. Instead, input signals Ca1 and Ca2 enable (disable) respective transistors T5 when asserted (de-asserted). Each of transistors T5 thus becomes the pull-up half of a push-pull driver, the other half of which is provided by the corresponding one of transistors T1 and T2. When signal Ca1 is high, for example, transistor T1 is on and the leftmost transistor T5 off; contrarily, when signals Ca1 is low, transistor T1 is off and the corresponding transistor T5 on.

Signal S2 is de-asserted in both single-ended modes so that all of transistors T7 are turned on. The tail impedance is thus reduced to decouple transistors T1 and T2, and thus to allow them to amplify uncorrelated data signals. Multiplexer M3 is thus a drive control circuit that decouples the complementary drive elements in the single ended mode. The tail current from the tail node Tail is determined in part by DAC 145, as in the differential mode, but also by DAC 140.

The current through tail node Tail and the tail impedance change with the relative values of input signals Ca1 and Ca2. For example, asserting both signals Ca1 and Ca2 turns both transistors T1 and T2 on, drawing about twice as much current from transistors T5 as when signals Ca1 and Ca2 express opposite levels. Current source 150 is enabled in the single-ended modes to accommodate these changes. Recalling that signal SE is asserted in both single-ended modes, AND gate 137 turns on transistor T6 whenever signals Ca1 and Ca2 are both asserted. AND gate 137 and transistor T6 thus control the impedance through the path from tail node Tail to ground, a reference node, depending upon the relative values of input signals Ca1 and Ca2. DAC 145 is tuned to calibrate the tail current and set tail node Tail to a desired voltage for opposite values of signals Ca1 and Ca2. In addition, when signals Ca1 and Ca2 are both asserted, DAC 140 is tuned to add the requisite current to tail node Tail to maintain that desired voltage.

Transistors T6 and T7, DACs 140 and 145, and the related control circuitry form two current sources 150 and 155 between tail node Tail and ground. Multiplexer M3, the DACs, and related control signals advantageously allow for tuning to accommodate e.g. process, voltage, and temperature variations, and to optimize drive characteristics for the supported signaling mode. Different types of current sources can be used in other embodiments. Furthermore, the two current sources are shown as distinct, but can be viewed as a single current source 133 that can be controlled to deliver the requisite tail current for the different patterns of input data Ca1 and Ca2.

Single-Ended Mode: RSL

Rambus Signaling Logic, or RSL, does not require termination at the driver side of a communication channel. Signal RSL can thus be asserted to effectively remove the M slices of block 105. Signal SE is asserted in both single-ended modes, so asserting signal RSL induces NAND gate 130 to output a logic zero. This, in turn, turns off transistors T3 to disable gates 135 and turns on transistors T4 to turn off transistors T5. Block 105 is thus effectively removed from driver 100 in the RSL mode. The remaining components of driver 100 work as noted above in connection with the PODL mode.

An output of a process for designing an integrated circuit, or a portion of an integrated circuit, comprising one or more of the circuits described herein may be a computer-readable medium such as, for example, a magnetic tape or an optical or magnetic disk. The computer-readable medium may be encoded with data structures or other information describing circuitry that may be physically instantiated as an integrated circuit or portion of an integrated circuit. Although various formats may be used for such encoding, these data structures are commonly written in Caltech Intermediate Format (CIF), Calma GDS II Stream Format (GDSII), or Electronic Design Interchange Format (EDIF). Those of skill in the art of integrated circuit design can develop such data structures from schematic diagrams of the type detailed above and the corresponding descriptions and encode the data structures on computer readable medium. Those of skill in the art of integrated circuit fabrication can use such encoded data to fabricate integrated circuits comprising one or more of the circuits described herein.

In the foregoing description and in the accompanying drawings, specific terminology and drawing symbols are set forth to provide a thorough understanding of the foregoing embodiments. In some instances, the terminology and symbols may imply specific details that are not required to practice the invention. For example, the transistors depicted in FIG. 1 are MOS transistors, but can be implemented using other types. For this reason, the claims describe transistors in terms of control and current-handling terminals, rather than e.g. gates, sources, and drains. Moreover, the systems detailed herein are binary and thus use two logic values, but other embodiments can support multi-PAM signals. Still other embodiments will be evident to those of skill in the art.

Some components are shown directly connected to one another while others are shown connected via intermediate components. In each instance the method of interconnection, or "coupling," establishes some desired electrical communication between two or more circuit nodes (e.g., pads, lines, or terminals). Such coupling may often be accomplished using a number of circuit configurations, as will be understood by those of skill in the art. Therefore, the spirit and scope of the appended claims should not be limited to the foregoing description. Only those claims specifically reciting "means for" or "step for" should be construed in the manner required under the sixth paragraph of 35 U.S.C. §112.

What is claimed is:

1. A driver, comprising:
   a circuit having complementary drive elements with a common tail node, the drive elements to, in a differential mode, transmit one input signal over a pair of complementary signal lines;
   at least one drive control circuit for the complementary drive elements to, in a single ended mode, decouple the complementary drive elements to enable separate drive of independent input signals over respective ones of the complementary signal lines;
   at least one path coupling the tail node of the complementary drive elements to a reference node in the single ended mode; and
   an impedance control circuit to change an impedance provided by the at least one path in the single ended mode responsive to the independent input signals.

2. The driver of claim 1, wherein the reference node provides a voltage that is low relative to the transmitted signal.

3. The driver of claim 2, wherein the voltage is ground potential.

4. The driver of claim 1, wherein the drive elements include first and second transistors interconnected at a tail node, and wherein the path extends from the tail node to the reference node.

5. The driver of claim 4, wherein the path includes a current source.

6. A driver comprising:
   a circuit having complementary drive elements interconnected at a common tail node, the drive elements to, in a differential driver mode, transmit one input signal over a pair of complementary signal lines, and, in a single ended driver mode, transmit first and second independent signals over respective ones of the complementary signal lines;

at least one drive control circuit for the complementary drive elements to, in each of two single ended modes, decouple the complementary drive elements to enable separate drive of independent input signals over respective ones of the complementary signal lines;

a pull-up circuit for each of the complementary drive elements to couple the respective drive circuit to a reference voltage;

a termination control circuit to disable the pull-up circuit for at least one of the complementary drive elements in one of the two single ended modes and to enable the pull-up circuit for the at least one of the complementary drive elements in the other of the two single ended modes; and a current source coupled to the common tail node and receiving the first and second independent signals, the current source to convey different tail currents from the common tail node for different patterns of the first and second independent signals in at least one of the single ended modes.

7. The driver of claim 6, wherein the reference voltage is high relative to the transmitted signal.

8. The driver of claim 7, wherein the reference voltage is VDD.

9. The driver of claim 6, wherein the pull up circuits for each complementary drive elements are disabled for both the complementary drive elements in the one of the single ended modes.

10. The driver of claim 6, wherein the single ended modes are Rambus Signaling Logic and Pseudo Open Drain Logic.

11. A driver comprising:
a circuit having complementary drive elements interconnected by a common tail node, the drive elements to, in a differential driver mode, transmit one input signal over a pair of complementary signal lines, and in a single ended driver mode transmit first and second independent signals over respective ones of the complementary signal lines;

at least one current source coupling the common tail node of the complementary drive elements to a voltage reference; and a control circuit to vary an amount of current supplied by the at least one current source in dependence on the first and second independent signals in the single ended driver mode.

12. The driver of claim 11, wherein the control circuit decouples the complementary drive elements in the single ended mode.

13. The driver of claim 12, wherein the control circuit varies the amount of current supplied by the at least one current source to supply a first current responsive to like values of the first and second independent signals and a second current responsive to opposite values of the first and second independent signals.

14. A driver to independently amplify uncorrelated first and second input signals, the driver comprising:
a first transistor having a first control terminal to receive the first input signal, a first current-handling terminal, and a second current-handling terminal;

a second transistor having a second control terminal to receive the second input signal, a third current-handling terminal, and a fourth current-handling terminal coupled to the second current-handling terminal of the first transistor at a tail node; and a current source coupled between the tail node and a supply terminal to pass a tail current, the current source having a first and second control terminals to receive the uncorrelated first and second input signals, the current source to vary the tail current responsive to the uncorrelated first and second input signals.

15. The driver of claim 14, wherein each of the first and second input signals exhibits voltages representative of first and second logic levels, and wherein the current source varies the tail current depending upon the respective voltages on the first and second control terminals.

16. The driver of claim 15, wherein the current source includes a control node to enable the current source to draw the same tail current from the tail node when similar or different voltages are presented on the first and second control terminals.

17. The driver of claim 14, wherein the current source draws a first tail current when the first and second input signals exhibit the same voltage level and a second tail current lower than the first tail current when the first and second input signals exhibit different voltage levels.

18. The driver of claim 17, wherein the different voltage levels include a high voltage level and a low voltage level, and wherein the same voltage levels are the high voltage level.

19. The driver of claim 18, wherein the current source draws a third tail current less than the first and second tail currents when the first and second input signals exhibit the low voltage level.

20. The driver of claim 17, wherein the current source comprises two sub-sources to collectively draw the first tail current, one of which sub-sources to draw the second tail current.

21. The driver of claim 14, further comprising a third transistor having a third control terminal, a fifth current-handling terminal coupled to the first current-handling terminal of the first transistor, and a sixth current-handling terminal coupled to a second supply node; and a fourth transistor having a fourth control terminal, a seventh current-handling terminal coupled to the third current-handling terminal of the second transistor, and an eighth current-handling terminal coupled to the second supply node.

22. The driver of claim 21, further comprising select logic to selectively couple the first control terminal to the third control terminal and the second control terminal to the fourth control terminal.

23. A driver that supports a differential mode and first and second single-ended modes, the driver comprising:
first and second output nodes to convey a differential signal in the differential mode and first and second uncorrelated signals in the single-ended modes;

a configurable termination block connected between the output nodes and a reference node, the termination block having a control node to disable the termination block in the first single-ended mode and enable the termination block in the second single-ended mode;

first and second transistors coupled between the first and second output nodes and a common tail node; and means for changing a current through the termination block and the common tail node depending upon the relative values of the uncorrelated signals in at least one of the single-ended modes.

24. The driver of claim 23, wherein the first and second transistors each have a first current-handling terminal connected to a respective one of the first and second output nodes and a second current-handling terminal connected to the means for changing the current.

* * * * *